(12) United States Patent
Kambara et al.

(10) Patent No.: US 11,506,691 B2
(45) Date of Patent: Nov. 22, 2022

(54) VOLTAGE MONITORING CIRCUIT

(71) Applicant: ROHM CO., LTD., Kyoto (JP)

(72) Inventors: Ayumu Kambara, Kyoto (JP); Yuki Inoue, Kyoto (JP); Hiroyuki Makimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 225 days.

(21) Appl. No.: 16/929,964

(22) Filed: Jul. 15, 2020

(65) Prior Publication Data
US 2021/0025922 A1    Jan. 28, 2021

(30) Foreign Application Priority Data

Jul. 24, 2019    (JP) .............................. JP2019-135850

(51) Int. Cl.
| | | |
|---|---|---|
| H03K 5/08 | (2006.01) | |
| G01R 19/00 | (2006.01) | |
| B60R 16/03 | (2006.01) | |
| G01R 19/165 | (2006.01) | |
| G05F 1/575 | (2006.01) | |

(52) U.S. Cl.
CPC .......... *G01R 19/0053* (2013.01); *B60R 16/03* (2013.01); *G01R 19/16519* (2013.01); *G05F 1/575* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,750,683 B2 * | 6/2004 | McClure | .......... | G01R 19/16547 327/539 |
| 2020/0326359 A1 * | 10/2020 | Terasaki | .......... | G01R 19/16504 |

FOREIGN PATENT DOCUMENTS

JP    2003075477    3/2003

* cited by examiner

*Primary Examiner* — Long Nguyen
(74) *Attorney, Agent, or Firm* — Fish & Richardson P.C.

(57) ABSTRACT

A voltage monitoring circuit monitors a magnitude relationship between a monitoring target voltage and a determination voltage and is capable of suppressing the influence of an offset of a reference voltage upon the determination voltage and setting the determination voltage as desired.
The voltage monitoring circuit includes: an input terminal, applied with a monitoring target voltage or a divided voltage of the monitoring target voltage; a reference voltage generating circuit, generating a first reference voltage; a linear power circuit, converting the first reference voltage to a second reference voltage; a feedback resistor, generating a divided voltage of the second reference voltage, and negatively feeding back the divided voltage of the second reference voltage to the linear power circuit; and a comparing portion, comparing the second reference voltage with the monitoring target voltage or the divided voltage of the monitoring target voltage applied to the input terminal.

13 Claims, 8 Drawing Sheets

VOLTAGE MONITORING CIRCUIT

BACKGROUND OF THE INVENTION

Field of the Invention

The present invention relates to a voltage monitoring circuit monitoring a magnitude relationship between a monitoring target voltage and a determination voltage.

Description of the Prior Art

FIG. 9 shows a diagram of a configuration example of a conventional voltage monitoring circuit. A voltage monitoring circuit 11 shown in FIG. 9 is mounted in a semiconductor integrated circuit device of a chip. The voltage monitoring circuit 11 includes resistors 12 and 13, a reference voltage generating circuit 14, a comparator 15, an input terminal T11 and an output terminal T12.

The monitoring target voltage MV is applied to the input terminal T11. A voltage divider circuit including the resistors 12 and 13 converts the monitoring target voltage MV to a divided voltage VDIV11, and supplies the divided voltage VDIV11 to a non-inverting input terminal of the comparator 15.

The reference voltage generating circuit 14 generates a specified reference voltage VREF11, and supplies the reference voltage VREF11 to an inverting input terminal of the comparator 15.

The comparator 15 generates a comparison signal S11 indicative of a comparison result between the divided voltage VDIV11 and the reference voltage VREF11, and outputs the comparison signal S11 through the output terminal T12 to outside of the voltage monitoring circuit 11. When the divided voltage VDIV11 is more than the reference voltage VREF11, the comparison signal S11 becomes a high-level signal. On the other hand, when the divided voltage VDIV11 is less than the reference voltage VREF11, the comparison signal S11 becomes a low-level signal. When the divided voltage VDIV11 is equal to the reference voltage VREF11, the comparison signal S11 may be any one between a high-level signal and a low-level signal.

Herein, if the resistance value of the resistor 12 is set to r12 and the resistance value of the resistor 13 is set to r13, equation (1) below is established, given that the divided voltage VDIV11 is equal to the reference voltage VREF11.

$$VDIV11=VREF11$$

$$MV \times r13/(r12+r13)=VREF11$$

$$MV=VREF11 \times (r12+r13)/r13 \quad (1)$$

The voltage monitoring circuit 11 is a circuit that monitors a magnitude relationship between the monitoring target voltage MV and a determination voltage (VREF11×(r12+r13)/r13) and outputs a monitoring result from the output terminal T12.

Furthermore, in the voltage monitoring circuit 11, in order to suppress the influence of an offset of the reference voltage VRFE11 upon the determination voltage, the resistors 12 and 13 are respectively set as resistive elements of which resistance values are adjustable by fine-tuning.

In addition, for example, a circuit identical to the voltage monitoring circuit 11 is disclosed in patent document 1.

PRIOR ART DOCUMENT

Patent Publication

[Patent document 1] Japan Patent Publication No. 2003-75477 (paragraphs [0002] to [0004])

SUMMARY OF THE INVENTION

Problems to be Solved by the Invention

Among users using voltage monitoring circuits, there are individuals that expect to set the type of a determination voltage of voltage monitoring circuits as desired on a user side.

Once fine-tuning of the resistors 12 and 13 of the voltage monitoring circuit 11 shown in FIG. 9 is complete, the determination voltage cannot be adjusted, which does not satisfy the need of a voltage monitoring circuit in which the type of a determination voltage may be set as desired on a user side.

A voltage monitoring circuit in which the type of a determination voltage may be set as desired on a user side is exemplified by a voltage monitoring circuit 21 in FIG. 10.

The voltage monitoring circuit 21 is mounted in a semiconductor integrated circuit device of a chip. The voltage monitoring circuit 21 includes a reference voltage generating circuit 22, a comparator 23, an input terminal T21 and an output terminal T22.

Resistors R1 and R2 are externally connected to the semiconductor integrated circuit device of a chip mounted with the voltage monitoring circuit 21. More specifically, a monitoring target voltage MV is applied to one terminal of the resistor R1, the other terminal of the resistor R1 and one terminal of the resistor R2 are connected to the input terminal T21, and the other terminal of the resistor R2 is connected to a ground potential.

A voltage divider circuit including the resistors R1 and R2 converts the monitoring target voltage MV to a divided voltage VDIV1, and supplies the divided voltage VDIV1 to the input terminal T21. The input terminal T21 supplies the divided voltage VDIV1 to a non-inverting input terminal of the comparator 23.

The reference voltage generating circuit 22 generates a specified reference voltage VREF21, and supplies the reference voltage VREF21 to an inverting input terminal of the comparator 23.

The comparator 23 generates a comparison signal S21 indicative of a comparison result between the divided voltage VDIV1 and the reference voltage VREF21, and outputs the comparison signal S21 through the output terminal T22 to outside of the voltage monitoring circuit 21. When the divided voltage VDIV1 is more than the reference voltage VREF21, the comparison signal S21 becomes a high-level signal. On the other hand, when the divided voltage VDIV1 is less than the reference voltage VREF21, the comparison signal S21 becomes a low-level signal. When the divided voltage VIDV1 is equal to the reference voltage VREF21, the comparison signal S1 may become any one between a high-level signal and a low-level signal.

Herein, if the resistance value of the resistor R1 is set to r1 and the resistance value of the resistor R2 is set to r2, equation (2) below is established, given that the divided voltage VDIV1 is equal to the reference voltage VREF21.

$$VDIV1=VREF21$$

$$MV \times r2/(r1+r2)=VREF21$$

$$MV=VREF21\times(r1+r2)/r2 \qquad (2)$$

The voltage monitoring circuit 21 is a circuit that monitors a magnitude relationship between the monitoring target voltage MV and a determination voltage (VREF21×(r1+r2)/r2) and outputs a monitoring result from the output terminal T22.

Since the resistors R1 and R2 are external resistors, in the voltage monitoring circuit 21, the determination voltage may be adjusted by selecting the resistance value r1 of the resistor R1 and the resistance value r2 of the resistor R2. However, the voltage monitoring circuit 21 has an issue of being incapable of suppressing the influence of an offset of the reference voltage VREF21 upon the determination voltage.

In view of the above issues, it is an object of the present invention to provide a voltage monitoring circuit that monitors a magnitude relationship between a monitoring target voltage and a determination voltage and is capable of suppressing the influence of an offset of a reference voltage upon the determination voltage and setting the determination voltage as desired.

Technical Means for Solving the Problem

A voltage monitoring circuit disclosed by the present invention is configured as below (first configuration), that is, including: an input terminal, applied with a monitoring target voltage or a divided voltage of the monitoring target voltage; a reference voltage generating circuit, generating a first reference voltage; a linear power circuit, converting the first reference voltage to a second reference voltage; a feedback resistor, generating a divided voltage of the second reference voltage, and negatively feeding back the divided voltage of the second reference voltage to the linear power circuit; and a comparing portion, comparing the second reference voltage with the monitoring target voltage or the divided voltage of the monitoring target voltage applied to the input terminal.

The voltage monitoring circuit of the first configuration may also be configured as below (second configuration), that is, wherein the input terminal is a first input terminal; and the comparing portion is a first comparing portion, and includes a second input terminal applied with a divided voltage of the monitoring target voltage in a value different from the monitoring target voltage or the divided voltage of the monitoring target voltage applied to the first input terminal, and a second comparing portion that compares the second reference voltage with the monitoring target voltage or the divided voltage of the monitoring target voltage applied to the input terminal.

The voltage monitoring circuit of the first or second configuration may also be configured as below (third configuration), that is, wherein the reference voltage generating circuit includes a depletion type FET (field-effect transistor) and an enhancement type FET.

The voltage monitoring circuit of any one of the first to third configurations may also be configured as below (fourth configuration), that is, wherein the feedback resistor includes a polysilicon film.

The voltage monitoring circuit of any one of the first to fourth configurations may also be configured as below (fifth configuration), that is, the voltage monitoring circuit is mounted in a semiconductor integrated circuit device of a chip; the voltage monitoring circuit includes an output terminal that outputs a comparison result of the comparing portion; the chip is shaped as a rectangle having a first side, a second side, a third side and a fourth side, at least one of the input terminal, the reference voltage generating circuit, the linear power circuit, the comparing portion and the output terminal is arranged at a position closer to the first side than the feedback resistor, at least one of the input terminal, the reference voltage generating circuit, the linear power circuit, the comparing portion and the output terminal is arranged at a position closer to the second side than the feedback resistor, at least one of the input terminal, the reference voltage generating circuit, the linear power circuit, the comparing portion and the output terminal is arranged at a position closer to the third side than the feedback resistor, and at least one of the input terminal, the reference voltage generating circuit, the linear power circuit, the comparing portion and the output terminal is arranged at a position closer to the fourth side than the feedback resistor.

The voltage monitoring circuit of the fifth configuration may also be configured as below (sixth configuration), that is, wherein the center of the rectangle is included in a position at which the feedback resistor is arranged.

The voltage monitoring circuit of any one of the first to sixth configurations may also be configured as below (seventh configuration), that is, wherein the reference voltage generating circuit and the linear power circuit are arranged at positions closer to the feedback resistor than the input terminal.

A control device disclosed by the present invention is configured as below (eighth configuration), that is, including: a control circuit, controlling a control target; and the voltage monitoring circuit of any one of the first to seventh configurations, resetting the control circuit according to the monitoring target voltage.

A vehicle disclosed by the present invention is configured as below (ninth configuration), that is, including the voltage monitoring circuit of any one of the first to seventh configurations.

Effect of the Invention

The voltage monitoring circuit disclosed by the present invention is capable of suppressing the influence of the offset of the reference voltage upon the determination voltage as well as setting the determination voltage as desired.

DETAILED DESCRIPTION OF THE EMBODIMENTS

First Embodiment

Figure 1:
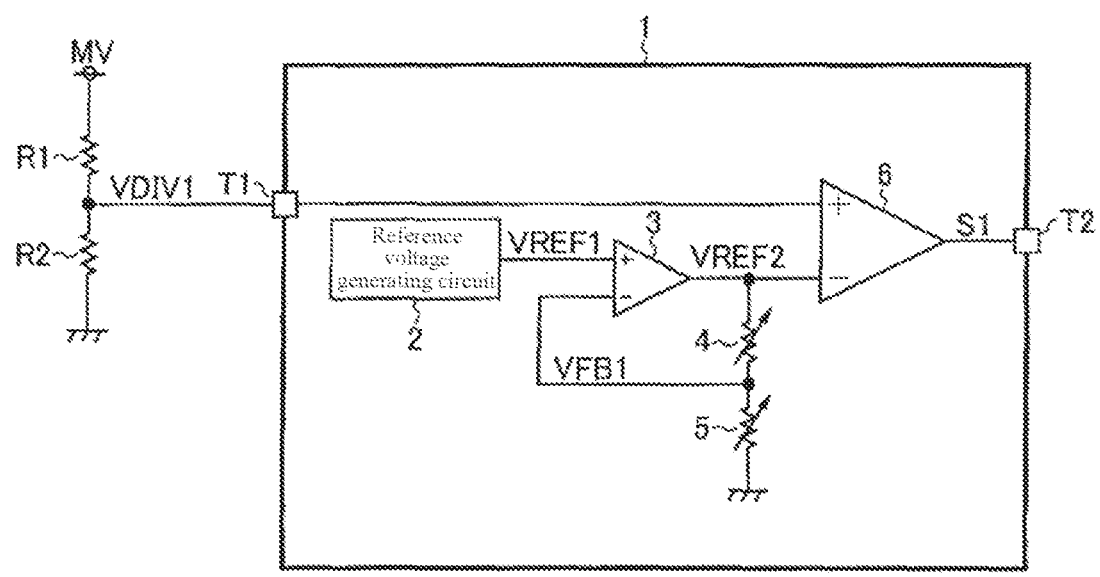
FIG. 1 is a diagram of the configuration of a voltage monitoring circuit according to a first embodiment.

FIG. 1 shows a diagram of the configuration of a voltage monitoring circuit according to a first embodiment. A voltage monitoring circuit 1 shown in FIG. 1 is mounted in a semiconductor integrated circuit device of a chip. The voltage monitoring circuit 1 includes a reference voltage generating circuit 2, a linear power circuit 3, feedback resistors 4 and 5, a comparator 6, an input terminal T1 and an output terminal T2.

Resistors R1 and R2 are externally connected to the semiconductor integrated circuit device of the chip mounted with the voltage monitoring circuit 1. More specifically, a monitoring target voltage MV is applied to one terminal of the resistor R1, the other terminal of the resistor R1 and one terminal of the resistor R2 are connected to the input terminal T1, and the other terminal of the resistor R2 is connected to a ground potential.

A voltage divider circuit including the resistors R1 and R2 converts the monitoring target voltage MV to a divided voltage VDIV1, and supplies the divided voltage VD1V1 to the input terminal T1. The input terminal T1 supplies the divided voltage VDIV1 to a non-inverting input terminal of the comparator 6.

The reference voltage generating circuit 2 generates a specified first reference voltage VREF1, and supplies the first reference voltage VREF1 to the linear power circuit 3.

Figure 2:
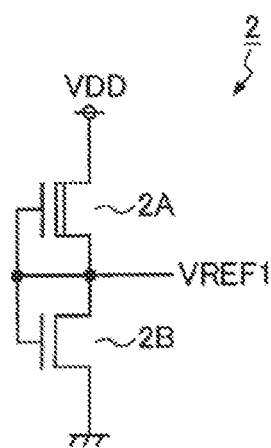
FIG. 2 is a diagram of a configuration example of a reference voltage generating circuit.

FIG. 2 shows a configuration example of the reference voltage generating circuit 2. The reference voltage generating circuit 2 of the configuration example shown in FIG. 2 includes an N-channel depletion type MOSFET (metal-oxide-semiconductor field-effect transistor) 2A and an N-channel enhancement type MOSFET 2B. The drain of the depletion type MOSFET 2A is applied with a power voltage VDD, and the source of the enhancement type MOSFET 2B is connected to a ground potential. The source and gate of the depletion type MOSFET 2A are commonly connected to the drain and gate of the enhancement type MOSFET 2B, and the first reference voltage VREF1 is outputted from a common connecting node thereof.

The first reference voltage VREF1 is represented by equation (3) below. Wherein, $V_{thn}$ is the threshold voltage of the enhancement type MOSFET 2B, $W_{DEP}$ is the gate width of the depletion type MOSFET 2A, $L_{DEP}$ is the gate length of the depletion type MOSFET 2A, $W_N$ is the gate width of the enhancement type MOSFET 2B, and $L_N$ is the gate length of the enhancement type MOSFET 2B.

$$VREF1 = V_{thn} \cdot \sqrt{\{(W_{DEP} \times L_N)/(W_N \times L_{DEP})\}} \quad (3)$$

The reference voltage generating circuit 2 is not limited to being the configuration example shown in FIG. 2, and may be, for example, a common bandgap reference voltage generating circuit. However, compared to a common bandgap reference voltage generating circuit, the reference voltage generating circuit 2 of the configuration example shown in FIG. 2 is capable of significantly reducing the circuit area.

Furthermore, the reference voltage generating circuit 2 of the configuration example shown in FIG. 2 also features good temperature characteristics. The change ratio $dVREF1/dT$ of the first reference voltage VREF1 with respect to temperature in the reference voltage generating circuit 2 of the configuration example shown in FIG. 2 is represented by equation (4) below. Wherein, $V_{thDEP}$ is the threshold voltage of the depletion type MOSFET 2A, $dV_{thDEP}/dT$ is the change ratio of the threshold voltage of the depletion type MOSFET 2A with respect to temperature, and $dV_{thn}/dT$ is the change ratio of the threshold voltage of the enhancement type MOSFET 2B with respect to temperature.

$$dVREF1/dT = dV_{thn}/dT - dV_{thDEP}/dT \times \sqrt{\{(W_{DEP} \times L_N)/(W_N \times L_{DEP})\}} \quad (4)$$

The change ratio $dV_{thDEP}/dT$ of the threshold voltage of the depletion type MOSFET 2A with respect to temperature and the change ratio $dV_{thn}/dT$ of the threshold voltage of the enhancement MOSFET 2B with respect to temperature are both positive. Thus, by adjusting the gate width $W_{DEP}$ of the depletion type MOSFET 2A, the gate length $L_{DEP}$ of the depletion type MOSFET 2A, the gate width $W_N$ of the enhancement type MOSFET 2B and the gate length $L_N$ of the enhancement type MOSFET 2B, the change ratio $dVREF1/dT$ of the first reference voltage VREF1 with respect to temperature is controlled to be substantially equal to zero.

Again referring to FIG. 1, details of the voltage monitoring circuit 1 are further provided below. The linear power circuit 3 converts the first reference voltage VREF1 to a specified second reference voltage VREF2 less than the first reference voltage VREF1. The linear power circuit 3 adjusts the second reference voltage VREF2 by way of approximating a feedback voltage VFB1 to the first reference voltage VREF1. Details of the feedback voltage VFB1 are to be provided in the description below.

For example, an LDO (low drop-out) may be used as the linear power circuit 3. When the linear power circuit 3 is implemented by an LDO, loss of the linear power circuit 3 may be decreased.

The feedback resistors 4 and 5 generate the feedback voltage VFB1 serving as a divided voltage of the second reference voltage VREF2, and negatively feeds back the feedback voltage VFB1 to the linear power circuit 3.

The comparator 6 generates a comparison signal S1 indicative of a comparison result between the divided voltage VDIV1 and the second reference voltage VREF2, and the comparison signal S1 is outputted through the output terminal T2 to outside of the voltage monitoring circuit 1. When the divided voltage VDIV1 is more than the second reference voltage VREF2, the comparison signal S1 becomes a high-level signal. On the other hand, when the divided voltage VDIV1 is less than the second reference voltage VREF2, the comparison signal S1 becomes a low-level signal. When the divided voltage VDIV1 is equal to the second reference voltage VREF2, the comparison signal S1 may be any one between a high-level signal and a low-level signal.

Herein, if the resistance value of the resistor R1 is set to r1, the resistance value of the resistor R2 is set to r2, the resistance value of the feedback resistor 4 is set to r4 and the resistance value of the feedback resistor 5 is set to r5, equation (5) below is established, given that the divided voltage VDIV1 is equal to the second reference voltage VREF2.

VDIV1=VREF2

$MV \times r2/(r1+r2) = VREF1 \times (r4+r5)/r5$ $MV = VREF1 \times (r1+r2) \times (r4+r5)/(r2 \times r5) \quad (5)$ The voltage monitoring circuit 1 is a circuit that monitors a magnitude relationship between the monitoring target voltage MV and the determination voltage (VREF1×(r1+r2)×(r4+r5)/(r2×r5)) and outputs the monitoring result from the output terminal T2. More specifically, the voltage monitoring circuit 1 outputs a low-level signal from the output terminal T2 upon detecting a reduction voltage in the monitoring target voltage MV.

Since the resistors R1 and R2 are so-called external resistors, in the voltage monitoring circuit 1, the determination voltage may be adjusted by selecting the resistance value r1 of the resistor R1 and the resistance value r2 of the resistor R2. Accordingly, in the voltage monitoring circuit 1, to suppress the influence of the offset of the first reference voltage VREF1 upon the determination voltage, the feedback resistors 4 and 5 are respectively set as resistive elements of which resistance values may be adjusted by fine-tuning. Thus, the influence of the offset of the first reference voltage VREF1 upon the determination voltage may be suppressed and the determination voltage may be set as desired according to the voltage monitoring circuit 1. In addition, from the perspective of reducing the areas of the feedback resistors 4 and 5, the feedback resistors 4 and 5 are preferably selectively formed by polysilicon films, respectively.

Figure 9:
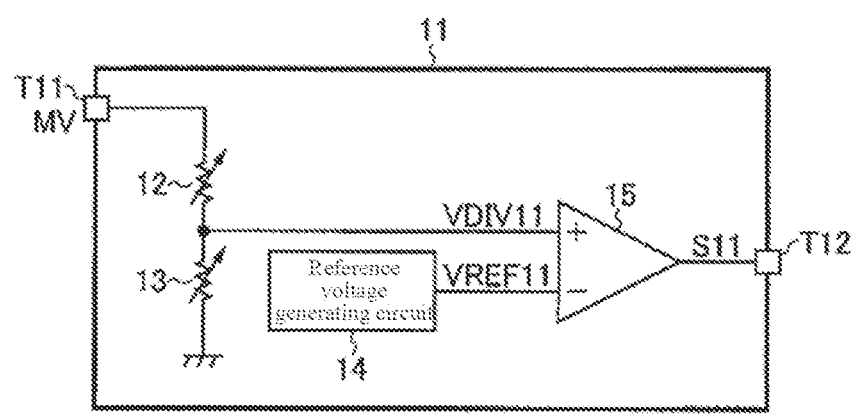
FIG. 9 is a diagram of a configuration example of a conventional voltage monitoring circuit.
Figure 10:
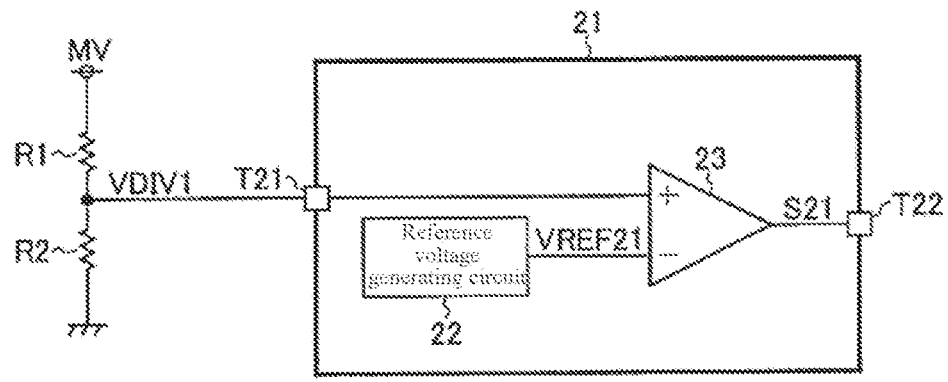
FIG. 10 is a diagram of another configuration example of a conventional voltage monitoring circuit.

The total area of the linear power circuit 3 and the feedback resistors 4 and 5 provided in the voltage monitoring circuit 1 may be set to be the same with the total area of the resistors 12 and 13 provided in the voltage monitoring circuit 11 shown in FIG. 9. Thus, the total area of the voltage monitoring circuit 1 may be set to be the same with the total area of the voltage monitoring circuit 11 shown in FIG. 9.

Figure 3:
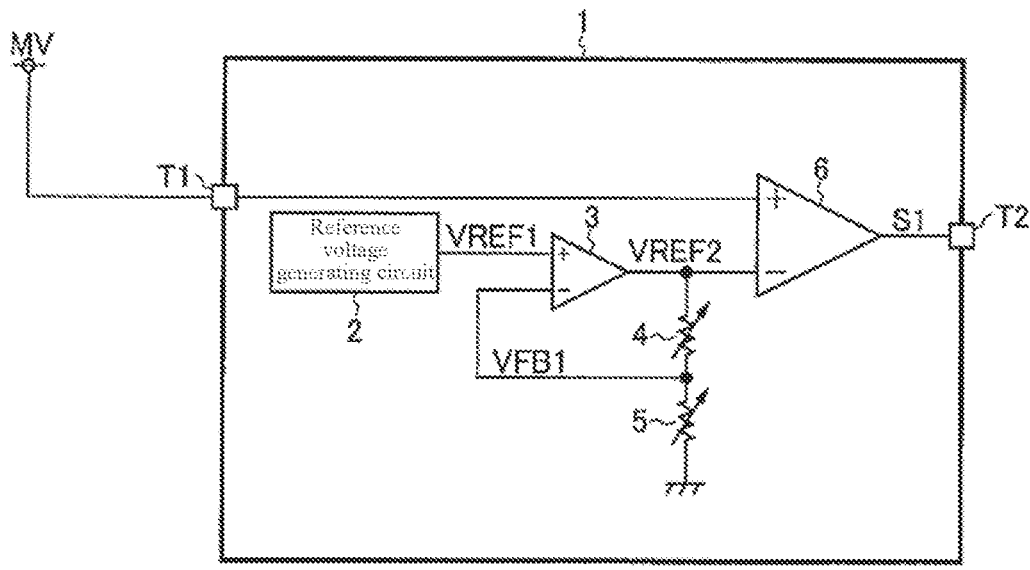
FIG. 3 is a diagram illustrating a variation example of the first embodiment.

In the description, the divided voltage VDIV1 of the monitoring target voltage MV is applied to the input terminal T1; however, the monitoring target voltage MV may also be applied to the input terminal T1, as shown in FIG. 3. The state of applying the monitoring target voltage MV to the input terminal T1 is substantially the same with the state of applying the divided voltage VDIV1 of the monitoring target voltage MV to the input terminal T1 under the setting of an extremely small ratio of the resistance value r1 of the resistor R1 to the resistance value r2 of the resistor R2.

Figure 4:
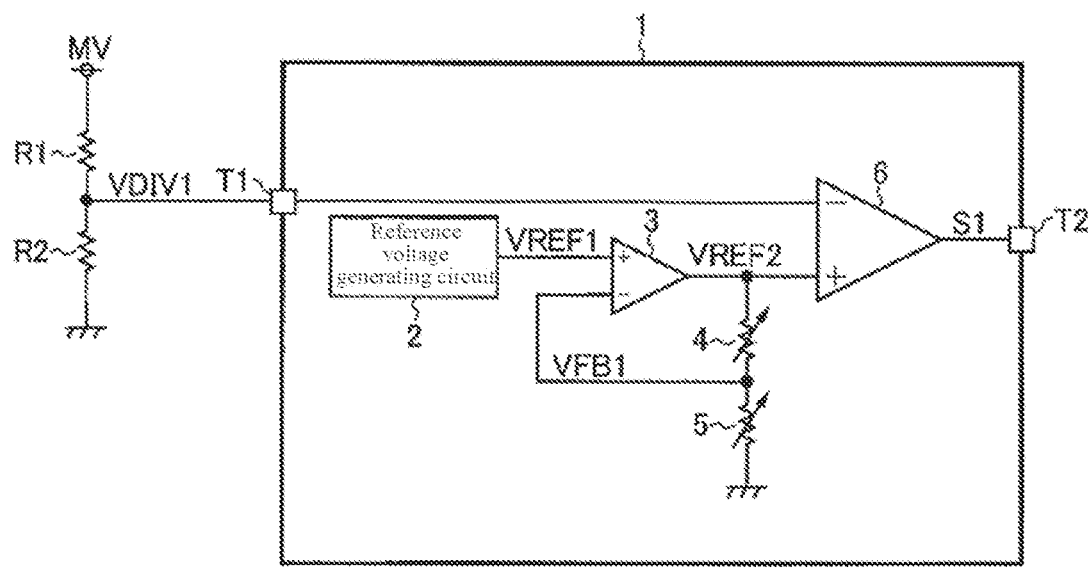
FIG. 4 is a diagram of another variation example of the first embodiment.

Furthermore, in the description, the voltage monitoring circuit 1 outputs a low-level signal from the output terminal T2 upon detecting a reduction voltage in the monitoring target voltage MV. However, a variation form of swapping the non-inverting input terminal and the inverting input terminal of the comparator 6 as shown in FIG. 4 may be implemented, that is, upon detecting an overvoltage in the monitoring target voltage MV, a low-level signal is outputted from the output terminal T2.

Second Embodiment

Figure 5:
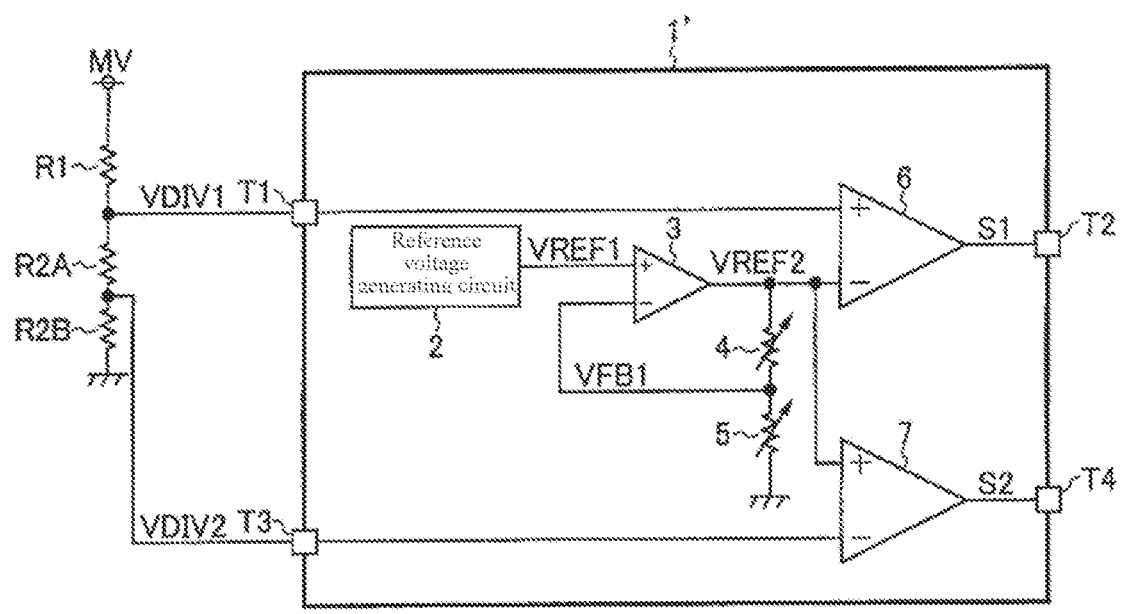
FIG. 5 is a diagram of the configuration of a voltage monitoring circuit according to a second embodiment.

FIG. 5 shows a diagram of the configuration of a voltage monitoring circuit according to a second embodiment. The voltage monitoring circuit 1' shown in FIG. 5 is mounted in a semiconductor integrated circuit device of a chip. The voltage monitoring circuit 1' includes a reference voltage generating circuit 2, a linear power circuit 3, feedback resistors 4 and 5, comparators 6 and 7, input terminals T1 and T3, and output terminals T2 and T4. Furthermore, details of the denotations in FIG. 5 the same with those in FIG. 1 are omitted for brevity. A composite resistor of a resistor R2A and a resistor R2B in FIG. 5 is equivalent to the resistor R2 in FIG. 1.

The voltage monitoring circuit 1' outputs a low-level signal from the output terminal T2 upon detecting a reduction voltage in the monitoring target voltage MV, and outputs a low-level signal from the output terminal T4 upon detecting an overvoltage in the monitoring target voltage MV. Associated details of reduction voltage detection of the monitoring target voltage MV are the same with those of the first embodiment, and are omitted herein for brevity. Associated details of overvoltage detection of the monitoring target voltage MV are given below.

A divided voltage VDIV2 of the monitoring target voltage MV is applied to the input terminal T3. The divided voltage VIDV2 of the monitoring target voltage MV is less than the divided voltage VDIV1 of the monitoring target voltage MV. The input terminal T3 supplies the divided voltage VDIV2 to an inverting input terminal of the comparator 7.

The comparator 7 generates a comparison signal S2 indicative of a comparison result between the divided voltage VDIV2 and the second reference voltage VREF2, and the comparison signal S2 is outputted through the output terminal T4 to outside of the voltage monitoring circuit 1'. When the divided voltage VDIV2 is less than the second reference voltage VREF2, the comparison signal S2 becomes a high-level signal. On the other hand, when the divided voltage VDIV2 is more than the second reference voltage VREF2, the comparison signal becomes a low-level signal. When the divided voltage VDIV2 is equal to the second reference voltage VREF2, the comparison signal S2 may become any one between a high-level signal and a low-level signal.

Herein, if the resistance value of the resistor R1 is set to r1, the resistance value of the composite resistor of the resistors R2A and R2B is set to r2, the resistance value of the resistor R2B is set to r2b, the resistance value of the feedback resistor 4 is set to r4, and the resistance value of the feedback resistor 5 is set to r5, equation (6) below is established, given that the divided voltage VDIV2 is equal to the second reference voltage VREF2.

$VDIV2=VREF2$ $MV \times r2b/(r1+r2)=VREF1 \times (r4-r5)/r5$ $MV=VREF1 \times (r1+r2) \times (r4+r5)/(r2b \times r5)$     (6)

The voltage monitoring circuit 1' is a circuit that monitors a magnitude relationship between the monitoring target voltage MV and the determination voltage (VREF1×(r1+r2)×(r4+r5)/(r2b×r5)) for overvoltage detection and outputs a monitoring result from the output terminal T4. More specifically, the voltage monitoring circuit 1' outputs a low-level signal from the output terminal T4 upon detecting an overvoltage in the monitoring target voltage MV.

Since the resistors R1, R2A and R2B are so-called external resistors, in the voltage monitoring circuit 1', the determination voltage for overvoltage detection may be adjusted by selecting the resistance value r1 of the resistor R1, the resistance value r2 of the composite resistor of the resistors R2A and R2B and the resistance value r2b of the resistor R2B. Thus, with respect to the determination voltage for reduction voltage detection and the determination voltage for overvoltage detection, the influence of the offset of the first reference voltage VREF1 upon the determination voltage may be suppressed and the determination voltage may be set as desired according to the voltage monitoring circuit 1'.

Figure 11:
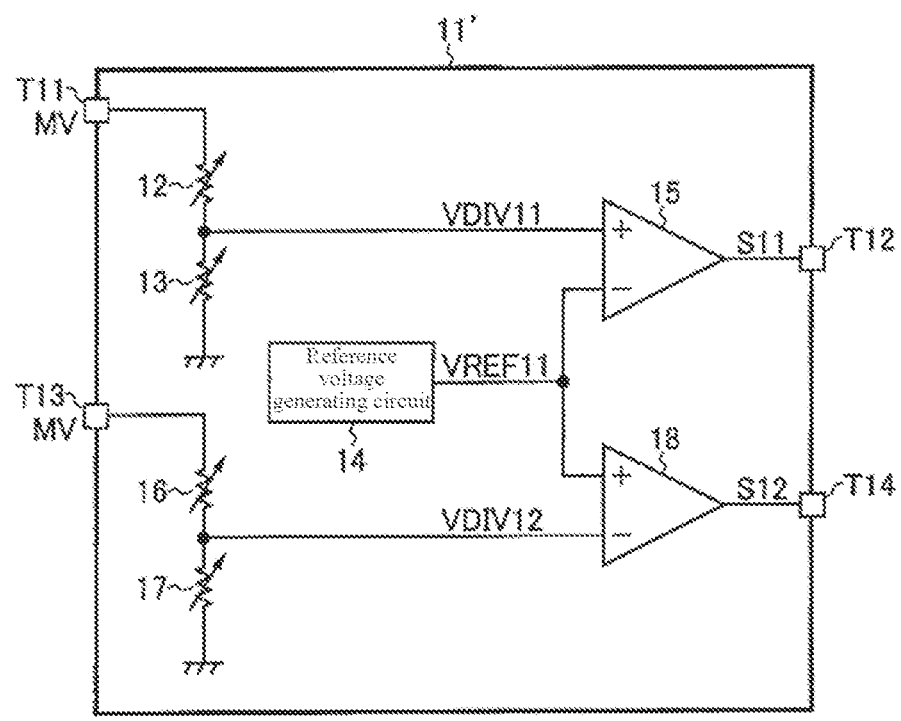
FIG. 11 is a diagram of yet another configuration example of a conventional voltage monitoring circuit.

Herein, to comparison with the voltage monitoring circuit 1', a conventional voltage monitoring circuit 11' shown in FIG. 11 is described. The configuration of the conventional voltage monitoring circuit 11' shown in FIG. 11 additionally incorporates resistors 16 and 17, a comparator 18, an input terminal T13 and an output terminal T14 into the conventional voltage monitoring circuit 11 shown in FIG. 9.

The voltage monitoring circuit 11' outputs a low-level signal from the output terminal T12 upon detecting a reduction voltage in the monitoring target voltage MV, and outputs a low-level signal from the output terminal T14 upon detecting an overvoltage in the monitoring target voltage MV. Associated details of reduction voltage detection of the monitoring target voltage MV are the same with those of the conventional voltage monitoring circuit 11 shown in FIG. 9, and are omitted herein for brevity. Associated details of overvoltage detection of the monitoring target voltage MV are provided below.

The monitoring target voltage MV is applied to the input terminal T13. A voltage divider circuit including the resistors 16 and 17 converts the monitoring target voltage MV to a divided voltage VDIV12, and supplies the divided voltage VDIV12 to an inverting input terminal of the comparator 18. The voltage divider circuit including the resistors 16 and 17 has a configuration identical to that of the voltage divider circuit including the resistors 12 and 13, but differs from the voltage divider circuit including the resistors 12 and 13 by implementation details of fine-tuning. As a result, the divided voltage VDIV12 is less than the divided voltage VDIV11.

Herein, if the resistance value of the resistor 16 is set to r16 and the resistance value of the resistor 17 is set to r17, equation (7) below is established, given that the divided voltage VDIV12 is equal to the reference voltage VREF11.

$$VDIV12 = VREF11$$

$$MV \times r16/(r16+r17) = VREF11$$

$$MV = VREF11 \times (r16+r17)/r17 \qquad (7)$$

The voltage monitoring circuit 11' is a circuit that monitors a magnitude relationship between the monitoring target voltage MV and the determination voltage (VREF11×(r16+r17)/r17) for overvoltage detection and outputs a monitoring result from the output terminal T14. More specifically, the voltage monitoring circuit 11' outputs a low-level signal from the output terminal T14 upon detecting an overvoltage in the monitoring target voltage MV.

In the voltage monitoring circuit 11', for example, when the area of the voltage divider circuit including the resistors 12 and 13 is 30% of the total area of the voltage monitoring circuit 11', the area of the voltage divider circuit including the resistors 16 ad 17 is 30% of the total area of the voltage monitoring circuit 11', and the area of the portion outside the voltage divider circuit is 40% of the total area of the voltage monitoring circuit 11', the total area of the voltage monitoring circuit 1' shown in FIG. 5 is reduced by 30% with respect to the total area of the voltage monitoring circuit 11' shown in FIG. 11. That is to say, the second embodiment is capable of achieving an area reduction effect that cannot be achieved by the first embodiment with respect to the conventional voltage monitoring circuit.

Figure 6:
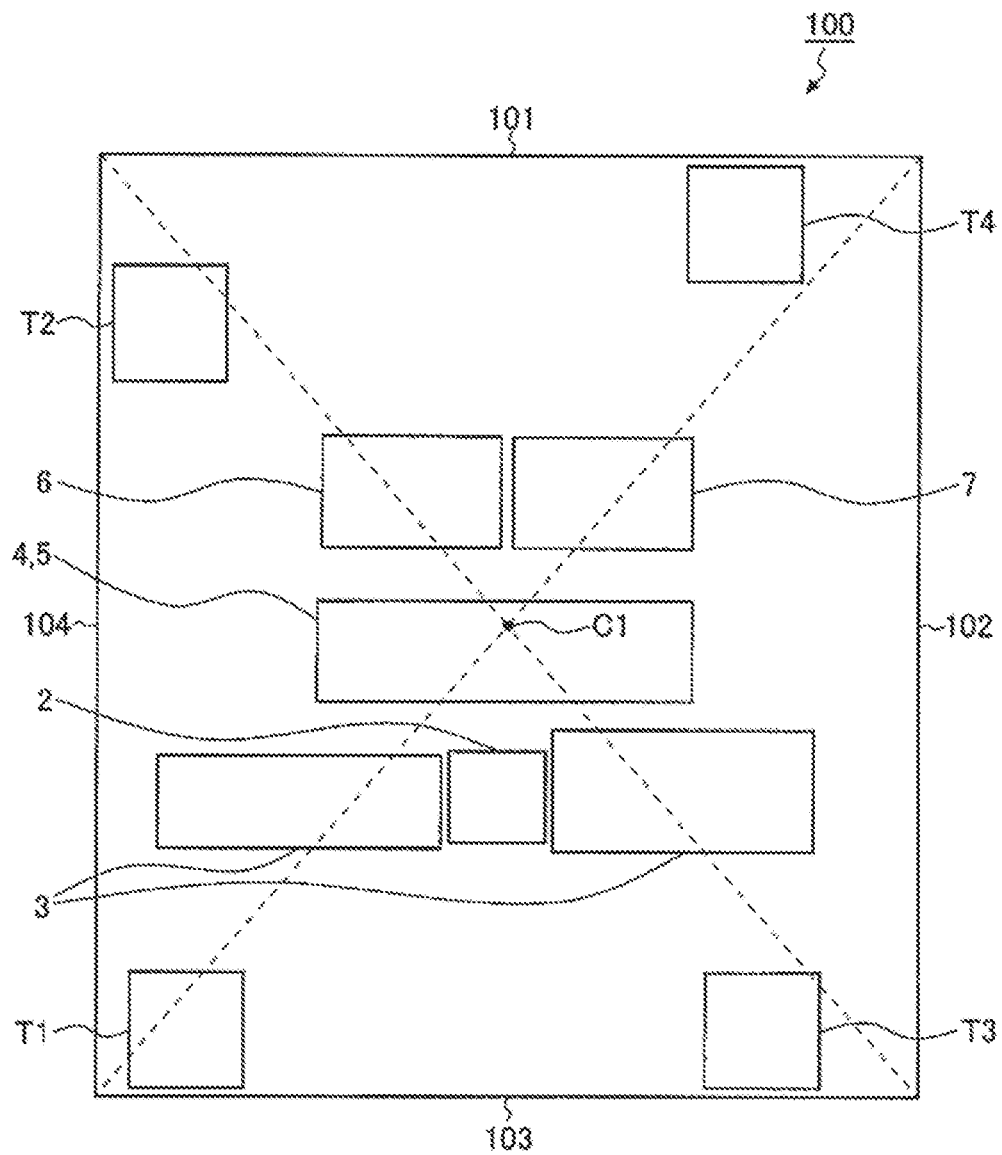
FIG. 6 is a top schematic diagram of a semiconductor integrated circuit device of a chip mounted with a voltage monitoring circuit according to the second embodiment.

FIG. 6 shows a top schematic diagram of a semiconductor integrated circuit device of a chip mounted with the voltage monitoring circuit 1'. Furthermore, parts in FIG. 6 identical to those in FIG. 5 are represented by the same denotations.

The semiconductor integrated circuit device of a chip mounted with the voltage monitoring circuit 1' includes a chip 100 shaped as a rectangle. The chip 100 has a first side 101, a second side 102, a third side 103 and a fourth side 104. The first side 101 and the third side 103 are opposite sides, and the second side 102 and the fourth side 104 are opposite sides.

The feedback resistors 4 and 5 are arranged in a manner of avoiding end portions of the chip 100. In other words, the feedback resistors 4 and 5 are arranged in a central portion of the chip 100 in order to suppress the value of the feedback voltage VFB1 after fine-tuning from deviating from a designed value caused by stress. From the perspective of minimizing the stress applied to the feedback resistors 4 and 5, the center C1 of the rectangle of the chip 100 is preferably included in positions at which the feedback resistors 4 and 5 are arranged, as shown in FIG. 6.

To arrange the feedback resistors 4 and 5 in the central portion of the chip 100, in the arrangement example in FIG. 6, the comparators 6 ad 7 and the output terminals T2 and T4 are arranged at positions closer to the first side 101 than the feedback resistors 4 and 5.

To arrange the feedback resistors 4 and 5 in the central portion of the chip 100, in the arrangement example in FIG. 6, the input terminal T3 and the output terminal T4 are arranged at positions closer to the second side 102 than the feedback resistors 4 and 5.

To arrange the feedback resistors 4 and 5 in the central portion of the chip 100, in the arrangement example in FIG. 6, the reference voltage generating circuit 2, the linear power circuit 3 and the input terminals T1 and T3 are arranged at positions closer to the third side 103 than the feedback resistors 4 and 5.

To arrange the feedback resistors 4 and 5 in the central portion of the chip 100, in the arrangement example in FIG. 6, the input terminal T1 and the output terminal T2 are arranged at positions closer to the fourth side 104 than the feedback resistors 4 and 5.

Furthermore, in the arrangement example in FIG. 6, the reference voltage generating circuit 2 and the linear power circuit 3 are arranged at positions closer to the feedback resistors 4 and 5 than the input terminals T1 and T3. Hence, wirings among circuit blocks including the reference voltage generating circuit 2, the linear power circuit 3 and the feedback resistors 4 and 5 may be shortened.

Furthermore, in the arrangement example in FIG. 6, in a direction parallel to the second side 102 and the fourth side 104, the reference voltage generating circuit 2, the linear power circuit 3, the feedback resistors 4 and 5 and the comparators 6 and 7 are arranged between the input terminals T1 and T3 and the output terminals T2 and T4. Hence, wirings between circuit blocks including the reference voltage generating circuit 2, the linear power circuit 3, the feedback resistors 4 and 5 and the comparators 6 and 7 and the input terminals T1 and T3 may be shortened, and wirings between circuit blocks including the reference voltage generating circuit 2, the linear power circuit 3, the feedback resistors 4 and 5 and the comparators 6 and 7 and the output terminals T2 and T4 may be shortened.

Furthermore, in the arrangement example in FIG. 6, in a direction parallel to the second side 102 and the fourth side 104, the comparators 6 and 7 are arranged between the reference voltage generating circuit 2, the linear power circuit 3 and feedback resistors 4 and 5 and the output terminals T2 and T4. Hence, the output terminal of the comparator 6 may be arranged closer to the output terminal T2, and the output terminal of the comparator 7 may be arranged closer to the output terminal T4. Hence, wirings between the output terminal of the comparator 6 and the output terminal T2 as well as the wirings between the output terminal of the comparator 7 and the output terminal T4 may be shortened.

Use

Figure 7:
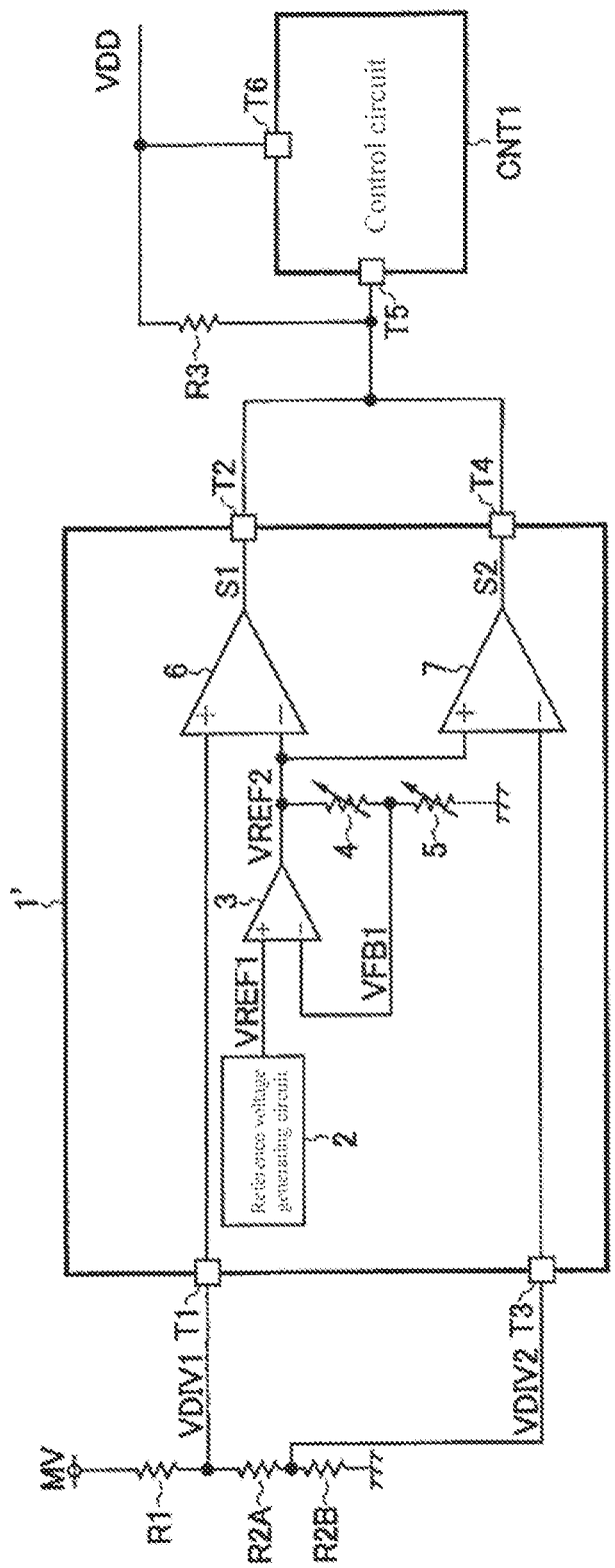
FIG. 7 is a diagram of a configuration example of a control device including a voltage monitoring circuit.

The voltage monitoring circuits 1 and 1' may be used, for example, preferably as a reset circuit. For example, a control device shown in FIG. 7 includes a control circuit CNT1 controlling a control target, and the voltage monitoring circuit 1' resetting the control circuit CNT1 according to the monitoring target voltage. The output terminals T2 and T4 of the voltage monitoring circuit 1' are connected to a reset terminal of the control circuit CNT1. One terminal of the resistor R3 is connected to a reset terminal T5 of the control circuit CNT1, and the other terminal of the resistor R3 is connected to a power terminal T6 of the control circuit CNT1. Moreover, a power voltage VDD is applied to the power terminal T6. The voltage monitoring circuit 1' outputs a low-level signal (reset signal) to the reset terminal T5 of the control circuit CNT1 upon detecting a reduction voltage or overvoltage in the monitoring target voltage MV. The control circuit CNT1 is kept in a reset state while the low-level signal (reset signal) is supplied to the reset terminal T5. The control circuit CNT1 may be implemented by an embedded computing module, a DSP (digital signal processor), a microcontroller, a microprocessor, a FPGA (field-programmable gate array), or an ASIC (application specific integrated circuit).

Figure 8:
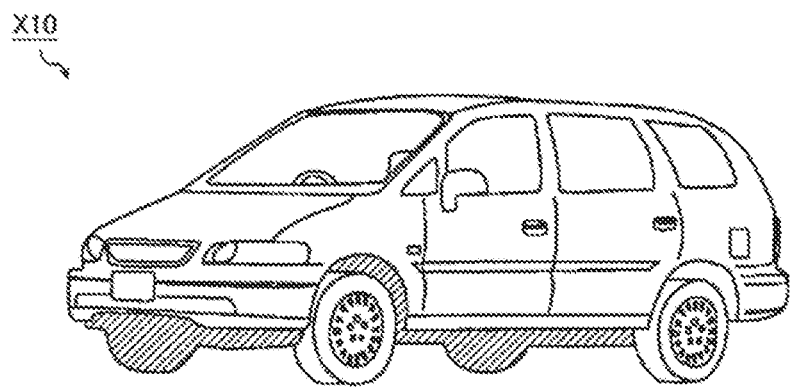
FIG. 8 is an appearance diagram of a vehicle mounted with a voltage monitoring circuit.

Furthermore, the voltage monitoring circuits 1 and 1' may be, for example, mounted in a vehicle X10 shown in FIG. 8, and are preferably used as circuits for monitoring any one of the voltages in an electrical system of the vehicle X10.

Notes

Apart from the described embodiments, various modifications may be made without departing from the technical inventive spirit of the technical features disclosed by the present invention. That is to say, the described embodiments are to be interpreted as examples in all aspects but not as limiting contents. The technical scope of the present invention is not represented by the description of the embodiments but is defined by the appended claims. It should be understood that equivalent meanings and all variations made within the scope are to be encompassed within the technical scope of the present invention.

What is claimed is:

1. A voltage monitoring circuit, comprising:
an input terminal, adapted to be applied with a monitoring target voltage or a divided voltage of the monitoring target voltage;
a reference voltage generating circuit, adapted to generate a first reference voltage;
a linear power circuit, adapted to convert the first reference voltage to a second reference voltage;
a feedback resistor, adapted to generate a divided voltage of the second reference voltage and negatively feed back the divided voltage of the second reference voltage to the linear power circuit; and
a comparing portion, adapted to compare the second reference voltage with the monitoring target voltage or the divided voltage of the monitoring target voltage applied to the input terminal.

2. The voltage monitoring circuit according to claim 1, wherein
the input terminal is a first input terminal; and
the comparing portion is a first comparing portion, and the voltage monitoring circuit comprises:
a second input terminal, adapted to be applied with the second divided voltage of the monitoring target voltage in a value different from the monitoring target voltage or the divided voltage of the monitoring target voltage applied to the first input terminal; and
a second comparing portion, adapted to compare the second reference voltage with the second divided voltage of the monitoring target voltage applied to the second input terminal.

3. The voltage monitoring circuit according to claim 1, wherein the reference voltage generating circuit comprises a depletion type FET and an enhancement type FET.

4. The voltage monitoring circuit according to claim 2, wherein the reference voltage generating circuit comprises a depletion type FET and an enhancement type FET.

5. The voltage monitoring circuit according to claim 1, wherein the feedback resistor comprises a polysilicon film.

6. The voltage monitoring circuit according to claim 1, being mounted in a semiconductor integrated circuit device of a chip, comprising an output terminal outputting a comparison result of the comparing portion, wherein:
the chip is shaped as a rectangle having a first side, a second side, a third side and a fourth side,
at least one of the input terminal, the reference voltage generating circuit, the linear power circuit, the comparing portion and the output terminal is arranged at a position closer to the first side than the feedback resistor,
at least one of the input terminal, the reference voltage generating circuit, the linear power circuit, the comparing portion and the output terminal is arranged at a position closer to the second side than the feedback resistor,
at least one of the input terminal, the reference voltage generating circuit, the linear power circuit, the comparing portion and the output terminal is arranged at a position closer to the third side than the feedback resistor, and
at least one of the input terminal, the reference voltage generating circuit, the linear power circuit, the comparing portion and the output terminal is arranged at a position closer to the fourth side than the feedback resistor.

7. The voltage monitoring circuit according to claim 2, being mounted in a semiconductor integrated circuit device of a chip, comprising an output terminal outputting a comparison result of the comparing portion, wherein:
the chip is shaped as a rectangle having a first side, a second side, a third side and a fourth side,
at least one of the input terminal, the reference voltage generating circuit, the linear power circuit, the comparing portion and the output terminal is arranged at a position closer to the first side than the feedback resistor,
at least one of the input terminal, the reference voltage generating circuit, the linear power circuit, the comparing portion and the output terminal is arranged at a position closer to the second side than the feedback resistor,
at least one of the input terminal, the reference voltage generating circuit, the linear power circuit, the comparing portion and the output terminal is arranged at a position closer to the third side than the feedback resistor, and
at least one of the input terminal, the reference voltage generating circuit, the linear power circuit, the comparing portion and the output terminal is arranged at a position closer to the fourth side than the feedback resistor.

8. The voltage monitoring circuit according to claim 3, being mounted in a semiconductor integrated circuit device of a chip, comprising an output terminal outputting a comparison result of the comparing portion, wherein:

the chip is shaped as a rectangle having a first side, a second side, a third side and a fourth side, at least one of the input terminal, the reference voltage generating circuit, the linear power circuit, the comparing portion and the output terminal is arranged at a position closer to the first side than the feedback resistor, at least one of the input terminal, the reference voltage generating circuit, the linear power circuit, the comparing portion and the output terminal is arranged at a position closer to the second side than the feedback resistor, at least one of the input terminal, the reference voltage generating circuit, the linear power circuit, the comparing portion and the output terminal is arranged at a position closer to the third side than the feedback resistor, and at least one of the input terminal, the reference voltage generating circuit, the linear power circuit, the comparing portion and the output terminal is arranged at a position closer to the fourth side than the feedback resistor.

9. The voltage monitoring circuit according to claim 5, being mounted in a semiconductor integrated circuit device of a chip, comprising an output terminal outputting a comparison result of the comparing portion, wherein:

the chip is shaped as a rectangle having a first side, a second side, a third side and a fourth side, at least one of the input terminal, the reference voltage generating circuit, the linear power circuit, the comparing portion and the output terminal is arranged at a position closer to the first side than the feedback resistor, at least one of the input terminal, the reference voltage generating circuit, the linear power circuit, the comparing portion and the output terminal is arranged at a position closer to the second side than the feedback resistor, at least one of the input terminal, the reference voltage generating circuit, the linear power circuit, the comparing portion and the output terminal is arranged at a position closer to the third side than the feedback resistor, and at least one of the input terminal, the reference voltage generating circuit, the linear power circuit, the comparing portion and the output terminal is arranged at a position closer to the fourth side than the feedback resistor.

10. The voltage monitoring circuit according to claim 6, wherein a center of the rectangle is comprised in a position at which the feedback resistor is arranged.

11. The voltage monitoring circuit according to claim 1, wherein the reference voltage generating circuit and the linear power circuit are arranged at positions closer to the feedback resistor than the input terminal.

12. A control device, comprising:

a control circuit, adapted to control a control target; and the voltage monitoring circuit according to claim 1, adapted to reset the control circuit according to the monitoring target voltage.

13. A vehicle, comprising the voltage monitoring circuit according to claim 1.

* * * * *